United States Patent [19]

Kim

[11] Patent Number: 5,461,593
[45] Date of Patent: Oct. 24, 1995

[54] WORD-LINE DRIVER FOR A SEMICONDUCTOR MEMORY DEVICE

[75] Inventor: Seung-Bong Kim, Seoul, Rep. of Korea

[73] Assignee: Goldstar Electron Co., Ltd., Seoul, Rep. of Korea

[21] Appl. No.: 326,424

[22] Filed: Oct. 20, 1994

[30] Foreign Application Priority Data

Sep. 14, 1994 [KR] Rep. of Korea ............... 23220/1994

[51] Int. Cl.[6] ..................................... G11C 11/40
[52] U.S. Cl. .................. 365/230.06; 365/230.08; 365/189.11; 326/108
[58] Field of Search ............ 365/230.06, 230.08, 365/189.11, 191; 326/106, 108

[56] References Cited

U.S. PATENT DOCUMENTS

| 4,514,829 | 4/1985 | Chao | 326/108 X |
| 4,788,457 | 11/1988 | Mashiko et al. | 326/108 |
| 4,953,133 | 8/1990 | Kashimura | 365/230.06 |

Primary Examiner—Joseph A. Popek
Assistant Examiner—Huan Hoang
Attorney, Agent, or Firm—Lowe, Price, LeBlanc & Becker

[57] ABSTRACT

A word-line driver of a semiconductor memory device having an address buffer for receiving a row address and a word-line decoder for converting an output signal of the address buffer into a word-line decoding signal is disclosed. The word-line driver includes: a first pull-up transistor for transferring a first row selecting signal to a first node connected to a first word line, responding to the word-line decoding signal; a first pull-down transistor connected between the first node and a ground voltage terminal for pulling down a voltage level of the first node, responding to a complementary signal of the first row selecting signal; a second pull-up transistor for transferring a second row selecting signal to a second node connected to a second word line, responding to the word-line decoding signal; a second pull-down transistor connected between the second node and a ground voltage terminal for pulling down a voltage level of the second node, responding to a complementary signal of the second row selecting signal; and a switching transistor connected between the first and second nodes which is controlled by the word-line decoding signal.

3 Claims, 2 Drawing Sheets

WORD-LINE DRIVER FOR A SEMICONDUCTOR MEMORY DEVICE

BACKGROUND OF THE INVENTION

1. Field of the Invention

The present invention relates to a semiconductor memory device and more particularly to a word-line driver for activating a word-line corresponding to a row address which is supplied from an external system out of the semiconductor memory device.

2. Description of the Prior Art

It has been well known that high packing density in a semiconductor memory device must accompany with achievements of high data accessing speed and low power dissipation. Though to implement the demands against the high density semiconductor memory device meets some limitations relevant to technical faculties for designing and manufacturing an integrated circuit at present, various efforts to be near the achievements as possible are being conducted.

In grading up the speed rate of the data access operation, that is to be advanced with the high packing density of the semiconductor memory device, the speed for selecting a memory cell as well as for sensing data on a pair of bit lines should be faster. To increase the speed for selecting a memory cell, a word-line connected to the memory cell must be activated in response to a row address which is input into the semiconductor memory device. As well known in this art, a semiconductor memory device, in order to select a word-line, essentially has an address input buffer for receiving an external row address, a word-line decoder (or a row decoder) for converting an internal row address from the address buffer into a word-line decoding signal (or row decoding signal) and a word-line driver for activating a word-line corresponding with the word-line decoding signal generated from the word-line decoder. The word-line driver has been developed in point of improving the reliability and operating speed, while the number of the word line drivers employed in the semiconductor memory device has been increased in accordance with the number of the memory cells.

With respect to techniques for the word-line driver, U.S. Pat. No. 4,514,829, issued on Apr. 30, 1985 to Hu H. Chao, provides a word-line driver for directing high packing density, high data accessing speed and low power dissipation. FIG. 1 shows the circuit configuration of Chao's word-line driver. In FIG. 1, two word-line drivers are selectively activated in response to the word-line decoding signal ADS generated from a word-line decoder (not shown). For the selective activation with the pair of word-line drivers, a row selecting signal which, as a source power, is applied to one word-line driver makes an influence to the other word-line driver. The circuit elements of M1, M2 and M3 form a first word-line driver, and those of M4, M5 and M6 make a second word-line driver. The signal R1 and 112 are the row selecting signals used as source powers respectively for the word-lines WL0 and WL1.

Concerning the operation for activating the word-line driver, the first and second word-line drivers are not activated when the word-line decoding signal ADS has been applied thereto as a high logic state (hereinbelow referred to a voltage level the same or near to an internal power supply voltage). On the contrary, receipt with the word-line decoding signal ADS of a low logic state (hereinbelow referred to a voltage level the same or near to ground voltage) makes the word-line drivers active. PMOS (P-channel Metal-Oxide-Semiconductor) transistor M1 of the first word-line driver and PMOS transistor M4 of the second word-line driver are turned on in response to the word-line decoding signal ADS of the low logic state. Assuming that the current row address is to select the word line WL0, the row selecting signal R1 will be active. On the other hand, assuming that the current row address is for selecting the word line WL1, the row selecting signal R2 will be active. Thus, when the word line WL0 is selected by the current row address the row selecting signals R1 and R2 become high and low logic states, respectively. Then, the word line WL0 has the same voltage level as that of the row selecting signal R1, and the word line WLI retains the ground voltage level by the turning-on of NMOS transistors M5 and M6. When the current row address selects the word line WL1 the row selecting signals R1 and R2 become respectively low and high logic states, which makes the word line WL1 retain the same voltage with that of the row selecting signal 112 while the word line WL0 retains the ground voltage level.

The word-line driver as shown in FIG. 1, however, is highly disadvantageous to an advanced semiconductor memory device with a larger capacity than 64 mega-bits, due to its own architecture consisting of at least six transistors which are necessary to drive two word lines. The occupation by the six transistors for two word lines causes the area for a peripheral circuit including a plurality of the word-line drivers to be increased, thus losing the use of valuable chip area and resulting in higher power dissipation rate.

U.S. Pat. No. 4,953, 133 describes another conventional configuration for the word-line driver, as shown in FIG. 2, in which, though six transistors are employed therein, one row selecting signal is utilized for one word-line driver so as to reduce unnecessary power dissipation. When a word-line decoding signal ADS is on high logic state a PMOS transistor M7 is turned off and a NMOS transistor M8 is turned on so that word lines WL0 and WL1 both retain voltage levels of low logic states if at least one of the row selecting signals R1 and R2 is on high logic state. The transistors M7 and M8 are turned on and off, respectively when the word-line decoding signal ADS is applied thereto as low logic state. In FIG. 2, assuming that a word-line driver for selecting a word line WL1 consists of transistors M9 and M10 and that a word-line driver for selecting a word line WL0 consists of transistors M11 and M12, the word-line driver receiving one of the row selecting signals R1 or 112 that is on low logic state, will activate and output a corresponding one of the word lines WL0 or WL1 at the high state. Also in the conventional word-line driver of FIG. 2, two word lines need six transistors as in the circuit of FIG. 1, which results in the increase of chip area occupied by a peripheral circuit including a plurality of such word-line drivers.

SUMMARY OF THE INVENTION

Accordingly, an object of the present invention is to provide a word-line driver compatible with a high packing density semiconductor memory device.

It is another object of the present invention to provide a word-line driver capable of reducing the power dissipation during an operation.

To achieve these and other objects, there is provided a word-line driver which includes: a first pull-up transistor for transferring a first row selecting signal to a first node connected to a first word line, responding to a word-line decoding signal; a first pull-down transistor connected between the first node and a ground voltage terminal and for pulling down the voltage level of the first node, responding to a complementary signal of the first row selecting signal; a second pull-up transistor for transferring a second row selecting signal to a second node connected to a second word line, responding to the word-line decoding signal; a second pull-down transistor connected between the second node and a ground voltage terminal and for pulling down the voltage level of the second node, responding to a complementary signal of the second row selecting signal; and a switching transistor connected between the first and second nodes which is controlled by the word-line decoding signal.

The above, and other objects, features, and advantages of the present invention will be apparent from the following detailed description of an illustrative embodiment that is to be read in conjunction with the accompanying drawings, in which the same reference numerals identify the corresponding elements and pans in the several views.

DETAILED DESCRIPTION OF THE PREFERRED EMBODIMENTS

Figure 1:
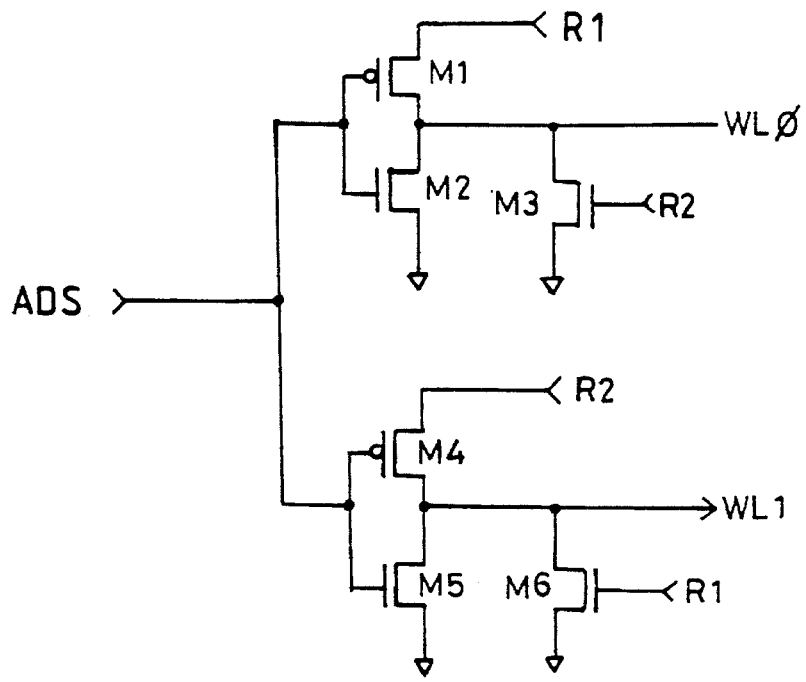
FIG. 1 is a circuit diagram of a conventional word-line driver.
Figure 2:
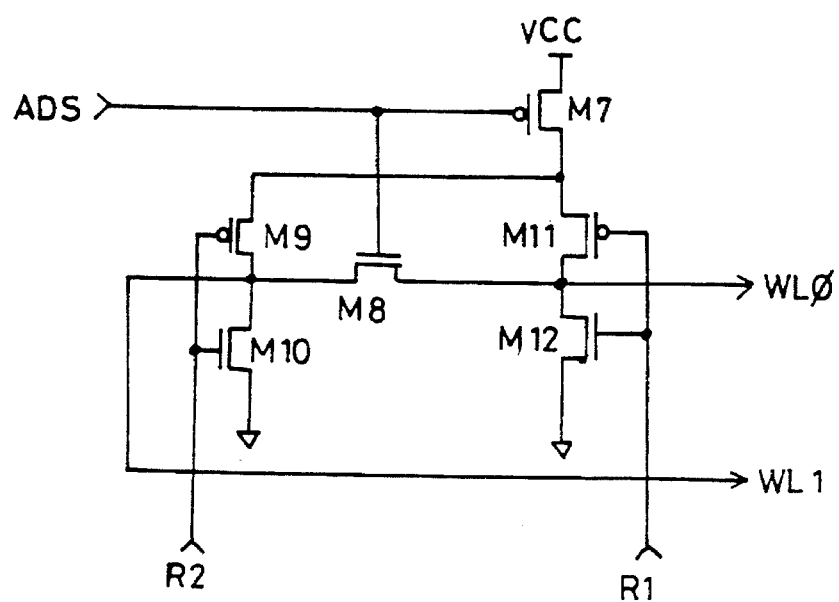
FIG. 2 is a circuit diagram of another conventional word-line driver.
Figure 3:
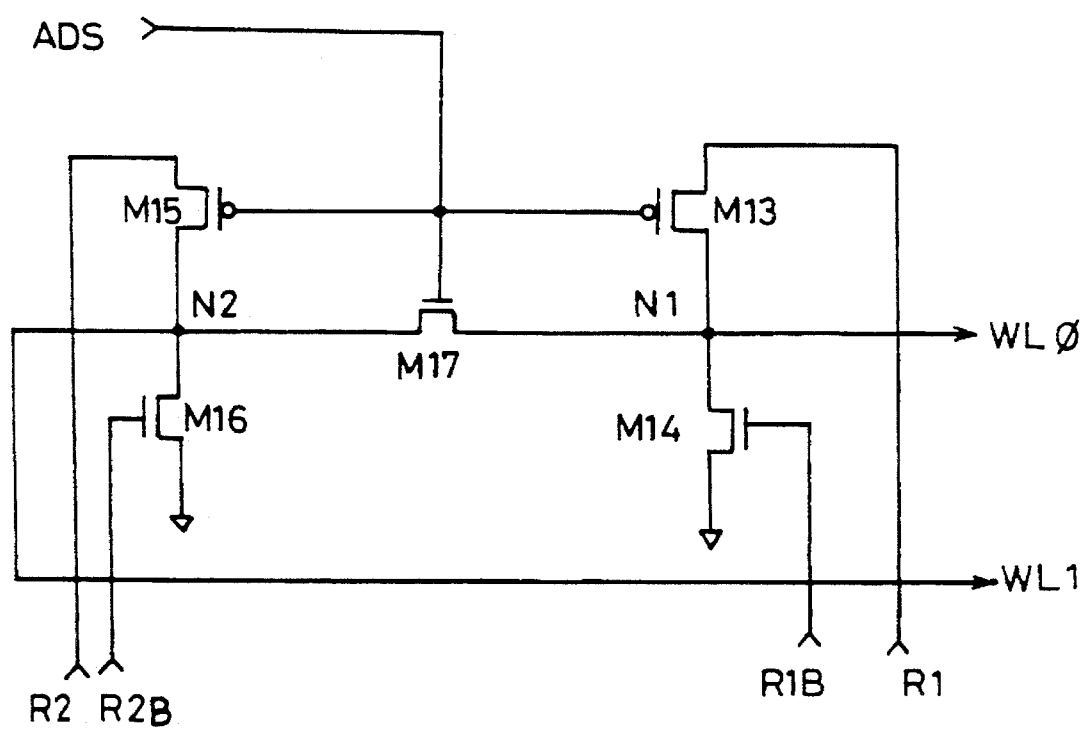
FIG. 3 is a circuit diagram of a word-line driver according to the present invention.

Referring to FIG. 3, a wordline decoding signal ADS is applied to the gate electrodes of PMOS transistors M13 and M15, and of NMOS transistor M17. The source of the PMOS transistor M13 is connected to first row selecting signal R1. The drain of the PMOS transistor M13 is connected to node N1 which is coupled to word line WL0. The source of PMOS transistor M15 is connected to second row selecting signal R2. The drain of the PMOS transistor M15 is connected to node N2 which is coupled to word line WL1. The channel of the NMOS transistor M17 is connected between the nodes N1 and N2. Complementary signal R1B of the first row selecting signal R1 is applied to the gate electrode of NMOS transistor M14 connected between the node N1 and ground, and complementary signal P,2B of the second row selecting signal R2 is applied to the gate electrode of NMOS transistor M16 connected between the node N1 and ground. The transistors M13 and M15 are used respectively for first and second pull-up transistors, and the transistor MI4 and M16 respectively for first and second pull-down transistors. The transistor M17 acts as a switching transistor.

It should be noted that each of the row selecting signals R1 and 112 retains a high logic state when activating to select a corresponding word line. In case of not selecting the word lines in disablement of the word-line driver, the word-line decoding signal ADS becomes high logic state. The first and second pull-up transistors M13 and M15 are turned off and the switching transistor M17 is mined on, responding to the word-line decoding signal ADS of high logic state. Thus, the nodes N1 and N2 are electrically connected therein so that the word lines WL0 and WL1 are coupled together. The word lines WL0 and WL1 both retain low logic states when at least one of the row selecting signals R1 and R2 has low logic state.

When selecting the word lines for activation of the word-line driver, the word-line decoding signal ADS is placed on low logic state, so that the first and second pull-up transistors M13 and M15 are turned on and the switching transistor M17 is turned off. Assuming that a row address applied is to select the word line WL0, the row selecting signals R1 and R2 are applied to the word-line driver as high and low logic states, respectively. Thus, the first pull-down transistor M14 is mined off while the first pull-up transistor M13 is turned on, resulting in the activation of the word line WL0 with high logic state that is the same voltage level with the row selecting signal R1. The word line WL1, also, retains low logic state and remains inactive. Assuming that an address has been applied therein to select the word line WL1, the row selecting signals R1 and 112 become low and high logic states, respectively. Thus, the second pull-down transistor M16 is turned off while the second pull-up transistor M15 is turned on, resulting in the activation of the word line WLI with high logic state that is the same voltage level with the row selecting signal R2. The word line WL0, also, retains low logic state and remains inactive.

What has been described is an improved, novel word-line driver which can perform the word line selecting functions using only five transistors. It should be noted that the decrease in the number of transistors consisting of one word-line driver makes a great influence for reducing the packing density of a semiconductor memory device, particularly of a peripheral circuit area, which includes a plurality of the word-line drivers. Furthermore, less transistors permit the power dissipation in the word-line driver to be reduced.

Although illustrative embodiment of the present invention has been described herein with reference to the accompanying drawings, it is to be understood that the present invention is not limited to this precise embodiment, and that various modifications can be effected therein by one skilled in the art without departing from the scope and spirit of the present invention. For example, under the status in minimizing the number of transistors consisting the word-line driver as shown in FIG. 3 the switching transistor M17 may be changed to another element. And the signals for decoding and selecting may have boosted voltage levels in order to enhance the driving efficiency for the word lines.

What is claimed is:

1. A word-line driver of a semiconductor memory device having an address buffer for receiving a row address and a word-line decoder for converting an output signal of the address buffer into a word-line decoding signal, the word-line driver comprising:

a first pull-up transistor for transferring a first row selecting signal to a first node connected to a first word line, responding to the word-line decoding signal;

a first pull-down transistor connected between the first node and a ground voltage terminal and for pulling down a voltage level of the first node, responding to a complementary signal of the first row selecting signal;

a second pull-up transistor for transferring a second row selecting signal to a second node connected to a second word line, responding to the word-line decoding signal;

a second pull-down transistor connected between the second node and a ground voltage terminal and for pulling down a voltage level of the second node, responding to a complementary signal of the second row selecting signal; and a switching transistor connected between the first and second nodes which is controlled by, the word-line decoding signal.

2. A word-line driver according to claim 1, wherein the first and second pull-up transistors are p-channel metal-oxide-semiconductor transistors.

3. A word-line driver according to claim 1, wherein the first and second pull-down transistors are n-channel metal-oxide-semiconductor transistors.

* * * * *